United States Patent [19]
Bloom et al.

[11] 4,032,340
[45] June 28, 1977

[54] METHOD OF IMPROVING THE SENSITIVITY OF ORGANIC VOLUME PHASE HOLOGRAPHIC RECORDING MEDIA

[75] Inventors: Allen Bloom, East Windsor; Robert Alfred Bartolini, Trenton; Herbert Alfred Weakliem, Pennington, all of N.J.

[73] Assignee: RCA Corporation, New York, N.Y.

[22] Filed: Apr. 10, 1975

[21] Appl. No.: 566,705

[52] U.S. Cl. .............................. 96/27 H; 96/27 R; 96/67; 96/115 R; 204/159.16; 350/3.5
[51] Int. Cl.² ..................... G03C 5/04; G03C 1/58
[58] Field of Search ............. 96/115 R, 27 H, 27 R, 96/67, 35.1; 350/3.5; 204/159.15

[56] References Cited

UNITED STATES PATENTS

| | | | |
|---|---|---|---|
| 3,658,526 | 4/1972 | Haugh | 96/27 |
| 3,885,964 | 5/1975 | Nacci | 96/115 R |
| 3,918,973 | 11/1975 | Mertens | 96/115 R |
| 3,926,637 | 12/1975 | Bartolini et al. | 96/27 H |

OTHER PUBLICATIONS

Moran et al., Applied Optics, vol. 12, No. 8, pp. 1964–1970, Aug. 1973.
Booth, Applied Optics, vol. 14, No. 3, pp. 596–601, Mar. 1975.

*Primary Examiner*—Jack P. Brammer
*Attorney, Agent, or Firm*—Glenn H. Bruestle; Birgit E. Morris; Joseph T. Harcarik

[57] ABSTRACT

The sensitivity of organic volume phase holographic recording media comprising an α-diketone in an acrylic polyester polymer can be improved by heating the recording media during or after recording.

4 Claims, 1 Drawing Figure

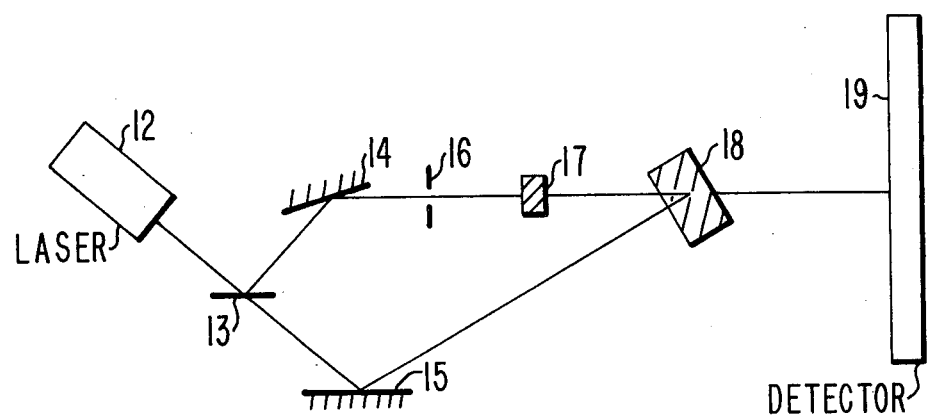

METHOD OF IMPROVING THE SENSITIVITY OF ORGANIC VOLUME PHASE HOLOGRAPHIC RECORDING MEDIA

This invention relates to a method of increasing the sensitivity of organic volume phase holographic recording media. More particularly, this invention relates to a method for decreasing the amount of exposure required to produce a permanent, high diffraction efficiency volume phase hologram in such media.

REFERENCE TO RELATED APPLICATIONS

This application is related to copending application of Bartolini and Bloom, "Permanent Organic Volume Phase Holographic Recording Medium," Ser. No. 403,408 filed Oct. 4, 1973 now U.S. Pat. No. 3,926,637 which describes the present recording media.

BACKGROUND OF THE INVENTION

In the copending application of Bartolini et al referred to above, and incorporated herein by reference, organic volume phase holographic recording media are disclosed which are useful to store holograms in permanent form. Such media comprise certain α-diketones in an acrylic polyester resin, which α-diketones are capable of hydrogen atom abstraction with the polymer hosts during recording. Such reaction is irreversible and these media thus can be used as high density information storage media which are simple and relatively inexpensive to make. However, a means to increase the sensitivity of such recording media, that is, means to decrease the amount of exposure or energy required to record holograms in such media, would further decrease the cost of recording.

SUMMARY OF THE INVENTION

We have found that the sensitivity of organic volume phase holographic storage media can be increased by heating the recording media during or after recording. Large decreases in the amount of exposure required to record a hologram are obtained at elevated temperatures, with concomitant savings in time and cost of recording.

BRIEF DESCRIPTION OF THE DRAWING

The FIGURE is a schematic diagram of an apparatus suitable for recording volume phase holograms.

DETAILED DESCRIPTION OF THE INVENTION

The holographic storage media useful in the present process comprise α-diketones capable of hydrogen atom abstraction dissolved in an acrylic polyester precursor and then cured. The α-diketones of the formula

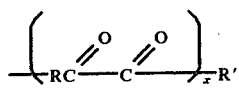

wherein R and R' independently can be methyl, a branched-chain alkyl group, or a cyclic hydrocarbon group wherein the carbon atoms are part of an aromatic or aliphatic ring, or R and R' together can form part of an aromatic or aliphatic ring; and $x$ is 1 or 2. Suitable α-diketones include benzil; 1,3- or 1,4-bis(-phenylglyoxalyl)benzene; camphorquinone; 2,3-butanedione; 1-phenyl-1,2-propanedione and the like.

The host material is an acrylic polyester which is curable with free radical catalysts, such as Castolite AP liquid casting plastic resin commercially available from the Castolite Company. These polyesters cure to form transparent, hard castings.

During recording, a photochemical reaction occurs whereby the α-diketone abstracts a hydrogen atom from the host resin, resulting in a change in the index of refraction of the medium and permanently storing a holographic grating in the medium.

The FIGURE is a schematic diagram of a system useful for recording and readout of holographic information in the recording media described above. Referring now to the FIGURE, the system includes a laser 12 which emits a coherent light beam. The light beam passes through a beam splitter 13. A portion of the beam is reflected from the beam splitter 13 onto a first mirror 14; the rest of the light beam passes through the splitter 13 and onto a second mirror 15. The mirrors 14 and 15 are adjusted so that the plane polarized beams reflected from them meet at a predetermined angle, such as 30° or 45°. The portion of the beam reflected from the beam splitter 13 is the object beam. The object beam passes through a shutter 16 and through the object to be recorded 17. The portion of the beam which passes through the beam splitter 13 is the reference beam. The recording medium 18 is positioned at the intersection of the reference and object beams. During readout, the shutter 16 is closed and only the reference beam passes through the recording medium. The image can be reviewed on a detector screen 19.

When more than one image is to be recorded in the recording medium, means for rotating or otherwise changing the selected portion of the recording medium exposed to the light beams is provided. During readout, means to rotate the recording medium or means to change the position or angle of the reference beam at the required angle of incidence will also be provided.

By recording at elevated temperatures, i.e. above room temperature, a large increase in sensitivity is achieved. Thus by recording at a temperature of about 70° C. for example, the sensitivity is increased by about 2 orders of magnitude. However, when a hologram is recorded at elevated temperatures and read out at room temperature, a shift in the Bragg planes results, with an accompanying distortion of the image in the recording plane. The recording medium can be rotated until the new readout angle which avoids the distortion is located. More preferably, this distortion can be avoided by recording at room temperature at the exposure conditions required for a predetermined temperature and intensity, and then heating the recording medium after recording to that predetermined temperature. When the hologram is recorded in this manner at room temperature, it can be read out at room temperature without a shift in the readout angle.

The recording media can be desensitized by exposure to unmodulated light after recording, as is disclosed in copending application of Bartolini et al. "Desensitization of Organic Volume Phase Holographic Recording Media" filed concurrently herewith.

The invention will be illustrated by the following example but the invention is not meant to be limited to the details described therein.

EXAMPLE 1

One gram of camphorquinone was admixed with 20 grams of Castolite resin. Seven drops of Castolite hardener were added, and the mixture was stirred and placed in a vacuum dessicator for several minutes to remove any gas bubbles. The solution was poured into several molds 2 × 4.5 × 1.3 cm in size and allowed to cure at room temperature for 4 days.

After removal from the molds, the castings were clear and hard and had a yellow color.

After slicing and polishing the castings, holograms were recorded in them at various temperatures to produce a hologram having a predetermined efficiency, while monitoring the time required for exposure. The exposure required was then determined. The data are summarized below in Table I.

Table 1

| Hologram Efficiency, % | Temperature of Recording, °C. | Exposure, Joules, cm² |
|---|---|---|
| 45 | 25 | 300 |
| 45 | 70 | 1.7 |
| 60 | 25 | 310 |
| 60 | 40 | 27 |
| 60 | 70 | 7 |

EXAMPLE 2

Castings prepared as in Example 1 were prepared and holograms recorded at room temperature employing a light source having an intensity of 0.27 watts/cm². After measuring the diffraction efficiency, the castings were then heated and cooled back to room temperature. A summary of the results obtained, varying the recording time and heating temperature, is given below in Table II.

Table 11

| Time, Seconds | Exposure, Joules/cm² | Initial Efficiency, % | Post Heating Temperature °C. | Final Efficiency, % |
|---|---|---|---|---|
| 10 | 2.7 | <1% | 70 | 6 |
| 25 | 6.8 | <1% | 70 | 36 |
| 50 | 13.5 | <1% | 70 | 53 |
| 75 | 20.4 | <1% | 70 | 66 |
| 25 | 6.8 | <1% | 40 | 6 |
| 50 | 13.5 | <1% | 40 | 21 |
| 100 | 27 | <1% | 40 | 60 |

The castings were stored for one week and read out again. The final efficiency remained unchanged.

We claim:

1. A method of increasing the sensitivity of an organic volume phase holographic recording medium comprising a cured, transparent acrylic polyester polymer containing a soluble α-diketone which is capable of hydrogen atom abstraction with the polyester polymer and has the formula

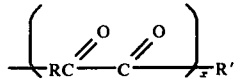

wherein R and R' independently are selected from the group consisting of methyl, branched-chain alkyl and cyclic hydrocarbon groups wherein the carbon atoms are part of an aromatic or aliphatic ring, and R and R' together can form part of an aromatic or aliphatic ring and x is an integer of 1 or 2, said α-diketone being present in an amount sufficient to cause a permanent change in the index of refraction of the medium when illuminated by a spatially modulated coherent light beam having a wavelength corresponding to the absorption band wavelength tail of the α-diketone which comprises:

heating the recording medium to an elevated temperature from about 40° C. upwards during or following the recording to increase the sensitivity.

2. A method according to claim 1 wherein said hologram is recorded at room temperature, then the recording medium is heated to an elevated temperature of from about 40° C. to about 70° C. and cooled prior to readout.

3. In the method for recording holograms which comprises changing the refractive index in the recording medium by exposing a recording medium comprising a cured, transparent, acrylic polyester containing an effective amount of a soluble α-diketone which is capable of hydrogen atom abstraction with the polyester polymer and has the formula

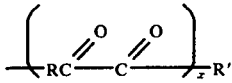

wherein R and R' independently are selected from the group consisting of methyl, branched-chain alkyl and cyclic hydrocarbon groups wherein the carbon atoms are part of an aromatic or aliphatic ring, and R and R' together can form part of an aromatic or aliphatic ring and x is an integer of 1 or 2, said α-diketone being present in an amount sufficient to cause a permanent change in the index of refraction of the medium when illuminated by a spatially modulated coherent light beam having a wavelength corresponding to the absorption band wavelength tail of the α-diketone to modulated light and detecting the refractive index changes, the improvement which comprises heating the medium during or after recording to an elevated temperature of from about 40° C. upwards to increase the sensitivity.

4. A method according to claim 3 wherein said medium is exposed at room temperature then heated at an elevated temperature of from about 40° C. to about 70° C. and cooled back to room temperature prior to detection of the refractive index changes.

* * * * *